(12) United States Patent
Stewart et al.

(10) Patent No.: US 11,271,040 B1
(45) Date of Patent: Mar. 8, 2022

(54) MEMORY DEVICE CONTAINING SELECTOR WITH CURRENT FOCUSING LAYER AND METHODS OF MAKING THE SAME

(71) Applicant: WESTERN DIGITAL TECHNOLOGIES, INC., San Jose, CA (US)

(72) Inventors: Derek Stewart, Livermore, CA (US); John Read, San Jose, CA (US); Michael Grobis, Campbell, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 17/075,980

(22) Filed: Oct. 21, 2020

(51) Int. Cl.

| | | |
|---|---|---|
| H01L 27/24 | (2006.01) |
| H01L 27/22 | (2006.01) |
| H01L 43/02 | (2006.01) |
| H01L 43/08 | (2006.01) |
| H01L 43/10 | (2006.01) |
| H01L 45/00 | (2006.01) |
| H01L 43/12 | (2006.01) |
| G11C 13/00 | (2006.01) |

(52) U.S. Cl.
CPC ........ *H01L 27/2427* (2013.01); *H01L 27/224* (2013.01); *H01L 43/02* (2013.01); *H01L 43/08* (2013.01); *H01L 43/10* (2013.01); *H01L 43/12* (2013.01); *H01L 45/06* (2013.01); *H01L 45/1273* (2013.01); *H01L 45/14* (2013.01); *H01L 45/1608* (2013.01); *H01L 45/1675* (2013.01); *G11C 13/0002* (2013.01); *G11C 13/0004* (2013.01)

(58) Field of Classification Search
None
See application file for complete search history.

(56) References Cited

U.S. PATENT DOCUMENTS

| | | | |
|---|---|---|---|
| 8,766,234 B1 * | 7/2014 | Hashim | H01L 27/2409 257/4 |
| 8,879,299 B2 | 11/2014 | Hou et al. | |
| 8,987,802 B2 | 3/2015 | Lee et al. | |
| 9,331,181 B2 | 5/2016 | Lee et al. | |
| 10,340,449 B2 | 7/2019 | Wu et al. | |
| 2013/0094278 A1 | 4/2013 | Hou et al. | |

(Continued)

OTHER PUBLICATIONS

Chekol, S. A. et al., "An excellent performance of a C—Te OTS device with amorphous Ge interfacial layer for selector application," Appl. Phys. Lett. 114, 102106 (2019); https://doi.org/10.1063/1.5087273.

(Continued)

*Primary Examiner* — Tan T. Nguyen
(74) *Attorney, Agent, or Firm* — The Marbury Law Group PLLC

(57) ABSTRACT

A memory cell includes an ovonic threshold switch (OTS) selector containing a first electrode, a second electrode, an OTS located between the first electrode and the second electrode, and a current focusing layer containing discrete electrically conductive current focusing regions having a width of 30 nm or less located between the first electrode and the OTS, and a memory device located in electrical series with the OTS selector.

20 Claims, 7 Drawing Sheets

(56) References Cited

U.S. PATENT DOCUMENTS

| | | | | |
|---|---|---|---|---|
| 2013/0171799 | A1* | 7/2013 | Miyanaga | H01L 45/16 438/382 |
| 2014/0169062 | A1 | 6/2014 | Lee et al. | |
| 2014/0225054 | A1* | 8/2014 | Yoneda | H01L 45/08 257/4 |
| 2014/0239365 | A1 | 8/2014 | Lee et al. | |
| 2014/0252447 | A1 | 9/2014 | Lee et al. | |
| 2016/0149128 | A1 | 5/2016 | Bodke et al. | |
| 2017/0125674 | A1 | 5/2017 | Yang et al. | |
| 2017/0244026 | A1* | 8/2017 | Wu | H01L 45/126 |
| 2017/0244031 | A1* | 8/2017 | Jeong | H01L 45/04 |
| 2017/0271406 | A1 | 9/2017 | Yang et al. | |
| 2017/0338279 | A1 | 11/2017 | Yang et al. | |
| 2018/0151623 | A1* | 5/2018 | Terai | H01L 45/1273 |
| 2018/0351093 | A1 | 12/2018 | Wu et al. | |
| 2020/0066794 | A1* | 2/2020 | Yasuda | H01L 45/085 |
| 2020/0168792 | A1* | 5/2020 | Song | H01L 27/249 |

OTHER PUBLICATIONS

Kim, Y. S., "Threshold Switching Characteristics of Te-doped Insulator Thin Films for the Application of Next-generation Non-volatile Memory," Ph.D. Dissertation, Department of Materials Science and Engineering College of Engineering, Seoul National University, Feb. 2018, (2018).

Nakatani, T. et al., "Improved current-perpendicular-toplane giant magnetoresistance outputs by heterogeneous Ag—In:Mn—Zn—O nanocomposite spacer layer prepared from Ag—In—Zn—O precursor," J. Appl. Phys. 126, 173904 (2019); https://doi.org/10.1063/1.5127176.

Pirovano, A. et al., "Scaling Analysis of Phase-Change Memory Technology", IEDM Technical Digest, 29.6.1 (2003).

Rubinetti, D. et al., "Innovation of Combustion Particle Control Technologies Assisted by Numerical Mod," Comsol Conference 2017 Rotterdam, Oct. 18-20, 2017.

Sato, Y. et al., "Localized Spin-Torque Effect in CPP-GMR Sensor with Current-Screen Layer," IEEE Transactions On Magnetics, vol. 46, No. 6, Jun. 2010, pp. 1610-1613, (2010).

Song, B. et al., "Threshold Switching Behavior of Ag—SiTe-Based Selector Device and Annealing Effect on Its Characteristics," Journal of the Electron Devices Society, vol. 6, pp. 674-679, (2018), *Digital Object Identifier* 10.1109/JEDS.2018.2836.

Wong, H.S. P. et al., "Phase Change Memory: A Comprehensive and Thorough Review of PCM Technologies, Including a Discussion of Material and Device Issues," Proceedings of the IEEE, vol. 98, No. 12, Dec. 2010, pp. 2201-2227, (2010).

U.S. Appl. No. 16/432,356, filed Jun. 5, 2019, SanDisk Technologies LLC.

U.S. Appl. No. 16/440,250, filed Jun. 13, 2019, SanDisk Technologies LLC.

U.S. Appl. No. 16/440,378, filed Jun. 13, 2019, Western Digital Technologies, Inc.

U.S. Appl. No. 16/442,858, filed Jun. 17, 2019, Western Digital Technologies, Inc.

U.S. Appl. No. 16/910,799, filed Jun. 24, 2020, SanDisk Technologies LLC.

U.S. Appl. No. 16/913,717, filed Jun. 26, 2020, SanDisk Technologies LLC.

U.S. Appl. No. 16/913,766, filed Jun. 26, 2020, SanDisk Technologies LLC.

Notification of Transmittal of the International Search Report and the Written Opinion of the International Searching Authority for International Patent Application No. PCT/US2021/033562, dated Nov. 17, 2021, 9 pages.

\* cited by examiner

MEMORY DEVICE CONTAINING SELECTOR WITH CURRENT FOCUSING LAYER AND METHODS OF MAKING THE SAME

FIELD

The present disclosure relates generally to the field of memory devices and specifically to ovonic threshold switch (OTS) selectors with a current focusing layer for magnetoresistive random access memory (MRAM) and phase change memory (PCM) devices and methods of making the same.

BACKGROUND

Spin-transfer torque (STT) refers to an effect in which the orientation of a magnetic layer in a magnetic tunnel junction or spin valve is modified by a spin-polarized current. Generally, electric current is unpolarized with electrons having random spin orientations. A spin polarized current is one in which electrons have a net non-zero spin due to a preferential spin orientation distribution. A spin-polarized current can be generated by passing electrical current through a magnetic polarizer layer. When the spin-polarized current flows through a free layer of a magnetic tunnel junction or a spin valve, the electrons in the spin-polarized current can transfer at least some of their angular momentum to the free layer, thereby producing a torque on the magnetization of the free layer. When a sufficient amount of spin-polarized current passes through the free layer, spin-transfer torque can be employed to flip the orientation of the spin (e.g., change the magnetization) in the free layer. A resistance differential of a magnetic tunnel junction between different magnetization states of the free layer can be employed to store data within the magnetoresistive random access memory (MRAM) cell depending if the magnetization of the free layer is parallel or antiparallel to the magnetization of the polarizer layer, also known as a reference layer.

SUMMARY

According to an aspect of the present disclosure, a memory cell includes an ovonic threshold switch (OTS) selector containing a first electrode, a second electrode, an OTS located between the first electrode and the second electrode, and a current focusing layer containing discrete electrically conductive current focusing regions having a width of 30 nm or less located between the first electrode and the OTS, and a memory device located in electrical series with the OTS selector.

DETAILED DESCRIPTION

Figure 1:
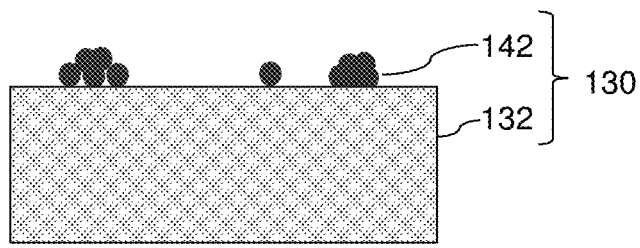
FIGS. 1 and 2A are vertical cross-sectional views of steps in a method of making an OTS selector with a current focusing layer according to a first embodiment of the present disclosure.

Embodiments of the present disclosure provide ovonic threshold switch (OTS) selectors (i.e., steering elements) with a current focusing layer for memory devices, such as magnetoresistive random access memory (MRAM) and phase change memory (PCM) cells and methods of making the same. MRAM cells can be used in high density crosspoint memory arrays, in which each crosspoint junction consists of a selector in series with an MRAM cell. In order to operate at low error rates, the electrical characteristics of the selectors should be controlled and matched to the properties of the MRAM cell. The current focusing layer improves the electrical characteristic of the selector and enables lower bit error rates when used in conjunction with a MRAM or PCM cell in crosspoint arrays. Specifically, the current focusing layer promotes current focusing and enhanced electric field in a small region of the OTS, which promotes the formation of conductive filaments in the OTS at one or more discrete locations. As a result, the characteristics of the OTS may be improved in one or more ways. The first is the reduction of the voltage required to turn on the selector during first fire and/or during operation. The reduction of threshold voltage limits the number of devices in a crosspoint array that are not able to be operated due to too high of threshold voltages, hence reducing bit error rates. The second potential improvement is decrease of the minimum current that a selector can sustain before turning off. This current is also known as the hold current. A low hold current allows memory cells to be read at lower currents, decreasing the probability that the memory state is disturbed by the read operation, thus decreasing bit error rates. Additional potential improvements include improved distributions of selector properties and longer endurance. Not all embodiments necessarily provide all of the possible improvements.

In the first embodiment, a discontinuous, electrically conductive dusting layer comprised of metal nanoclusters is used as the current focusing layer. In the second embodiment, a metal-dielectric composite layer that includes confined current paths is used as the current focusing layer. In the third embodiment, a filamentary breakdown layer which forms electrically conductive filaments upon application of a current and/or voltage across the layer is used as the current focusing layer.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

Figure 2A:
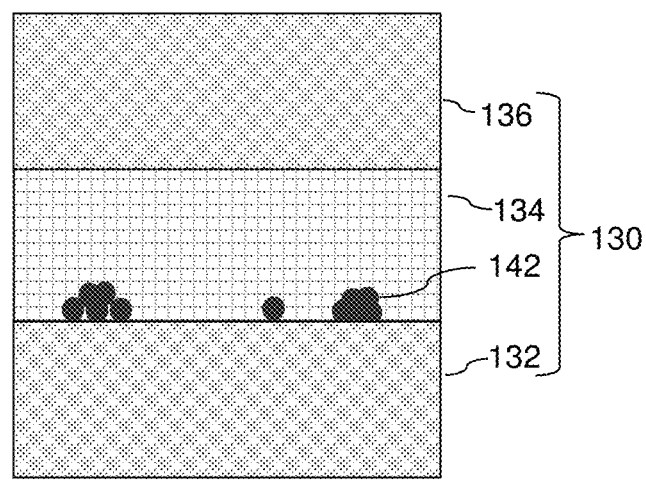

FIGS. 1 and 2A are vertical cross-sectional views of steps in a method of making an OTS selector 130 with a current focusing layer which comprises a metal dusting layer 142 according to a first embodiment of the present disclosure. As shown in FIG. 1, the metal dusting layer 142 is deposited on the first electrode 132 of an in-process OTS selector (e.g., steering element) 130 of a memory cell.

The first electrode 132 may comprise any suitable electrically conductive material, such as a metal, such as tungsten, copper, titanium, ruthenium, a metal alloy, an electrically conductive metal nitride, such as titanium nitride, tungsten nitride or tantalum nitride, or an electrically conductive carbon based material, such as amorphous carbon, amorphous boron-doped carbon, amorphous nitrogen-doped carbon (CN), metal-carbon alloys or other carbon alloys, and layer stacks thereof.

In one embodiment, the dusting layer 142 of the first embodiment of the present disclosure is a sub-monolayer film having a thickness of less than one monolayer which is composed of plural discrete nanoclusters. The metal dusting layer 142 may be deposited, for example, by physical vapor deposition of at least one elemental metal. The metal dusting layer 142 can consist essentially of at least one elemental metal, i.e., a metallic element in an elemental form. The at least one elemental metal can be selected from Ti, Zr, Jr, Mg, Pt, W, Ta, Hf, Cr, Fe, Cu, Nb, Mo, Sc, Y, Pd, Au, Os, Ru, or Rh. Alternatively, the dusting layer can include a metal nitride, such as TiN. If the dusting layer 142 is incorporated into an MRAM memory cell, then the dusting layer 142 may include a non-magnetic material.

For example, in one method of depositing the dusting layer 142, two metals that are not miscible (e.g., Ti and Zr) are used. A thin continuous layer of the first metal (e.g. Ti) is deposited on top of the first electrode 132. After this, an ultrathin layer (e.g., 1 monolayer thickness or less) of the second metal (e.g., Zr) is deposited on top of the first metal such that nanoclusters (e.g., islands/droplets) of Zr form on the Ti layer. The Ti layer becomes part of the first electrode 132, while the Zr nanoclusters make up the dusting layer 142. Alternatively, if the first electrode 132 comprises a material (e.g., Ti) which is not miscible with the material of the nanoclusters (e.g., Zr), then the deposition of the first layer may be omitted. Other suitable immiscible metal layer pair may be used instead, such as Au/Cr, Cu/Nb, Fe/Os, Fe/Ru, Mo/Sc, Os/Pt, Sc/Y, or Ti/Zr.

An alternative method of depositing the dusting layer 142 includes repeated depositions of an ultra-thin metal layer (e.g., 3 monolayers or less such as 1-2 monolayers) on a carbon based first electrode 132 such as carbon or CN. The metal layer may include ruthenium, titanium and/or titanium nitride. For example, stacks may comprise CN/Ru, CN/Ti/Ru, or CN/TiN/Ru. The carbon based material changes the local morphology of the ultra-thin metal dusting layer 142 sufficiently to alter the interfacial roughness and form nanocluster structures of the metal dusting layer.

In another alternative method of depositing the dusting layer 142, a sputter etching processing step is performed after the deposition of the above described ultra-thin metal dusting layer 142 on the carbon based first electrode 132, such as carbon or CNx. For example, sputter etching of stacks comprising CN/Ru, CN/Ti/Ru, CN/TiN/Ru may also change the local surface morphology such that regions of the metal dusting layer 142 such that a surface of the first electrode 132 is uncovered between the regions of the discontinuous metal dusting layer 142.

In one embodiment, the thickness of the metal dusting layer 142 can be in a range from 0.1 nm to 1.2 nm, such as from 0.1 nm to 0.8 nm, and/or from 0.2 nm to 0.5 nm. In one embodiment, the metal dusting layer 142 has a sub-monolayer thickness and includes openings therethrough. In one embodiment, the metal dusting layer 142 is discontinuous, i.e., includes multiple nanoclusters that do not contact one another. The number of metal atoms in each cluster may be in a range from 1 to 100. In this case, the thickness of the metal dusting layer 142 may be in a range from 0.1 nm to 0.2 nm. The width (i.e., the dimension parallel to the top surface of the first electrode 132) of each nanocluster may be less than 5 nm, such as less than 2 nm, such as 0.1 nm to 1 nm, including 0.1 nm to 0.2 nm.

As shown in FIG. 2A, the OTS 134 is deposited directly on the dusting layer 142. A second electrode 136 is then deposited over the OTS 134 to complete the selector 130.

As used herein, the ovonic threshold switch (OTS) 134 is a device that does not crystallize in a low resistance state under a voltage above the threshold voltage, and reverts back to a high resistance state when not subjected to a voltage above the threshold voltage across the OTS material layer. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage.

An ovonic threshold switch material (OTS material) can be non-crystalline (for example, amorphous) in a high resistance state, and can remain non-crystalline (for example, remain amorphous) in a low resistance state during application of a voltage above its threshold voltage across the OTS material. The OTS material can revert back to the high resistance state when the high voltage above its threshold voltage is removed. Throughout the resistive state changes, the ovonic threshold switch material can remain non-crystalline (e.g., amorphous). In one embodiment, the ovonic threshold switch material can comprise layer a chalcogenide material which exhibits hysteresis in both the write and read states. Chalcogenide selectors can be comprised of binary, tertiary, or quaternary alloys of Si, Ge, Se, Te, and As, and doped with B, C, N, P, S, In, Sn, Sb, Pb, Zn, Bi and/or O. Exemplary chalcogenide selectors may be a SiTe compound, GeTe compound, a GeSe compound, a GeSeAs compound, or a GeSeAsTe compound, doped with N, Si, and/or C.

In one embodiment, the material of the OTS 134 can be selected such that the resistivity of the OTS decreases at least by two orders of magnitude (i.e., by more than a factor of 100) upon application of an external bias voltage that exceeds a critical bias voltage magnitude (also referred to as threshold voltage). In one embodiment, the composition and the thickness of the OTS 134 can be selected such that the critical bias voltage magnitude can be in a range from 1 V to 4 V, although lesser and greater voltages can also be employed for the critical bias voltage magnitude. The thickness of the OTS 134 can be, for example, in a range from 5 nm to 40 nm, such as 10 nm to 20 nm, although lesser and greater thicknesses can also be employed.

Figure 2B:
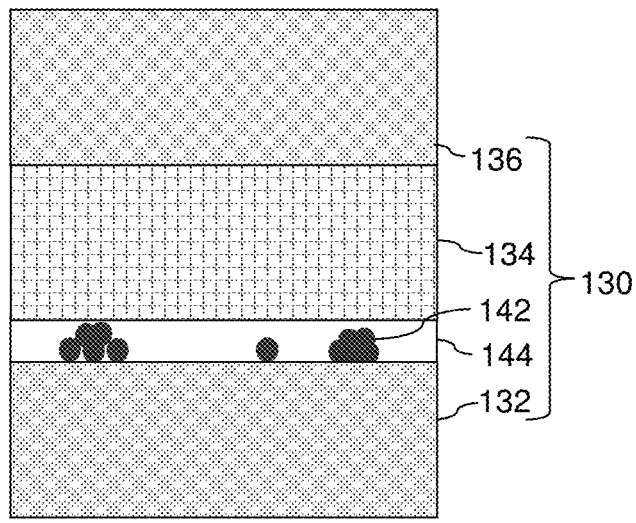
FIGS. 2B, 2C and 2D are vertical cross-sectional views of OTS selectors with a current focusing layer according to an alternative configurations of the first embodiment of the present disclosure.

FIG. 2B is a vertical cross-sectional view of an OTS selector 130 with a current focusing layer according to an alternative configuration of the first embodiment of the present disclosure. In this configuration, the metal nanoclusters of the dusting layer 142 are embedded (i.e., encapsulated) in an electrically insulating layer 144. The insulating layer 144 may be formed over the first electrode 132 and the dusting layer 142 such that at least top surfaces of the nanoclusters of the dusting layer 142 are exposed in the top surface of the insulating layer 144. Thus, the nanoclusters of the dusting layer 142 contact the OTS 134 which is deposited on the dusting layer 142 and the insulating layer 144.

The insulating layer 144 may comprise silicon oxide, metal oxide or silicon nitride layer having a thickness of 2 nm or less, such as 0.1 to 1 nm. The insulating layer 144 may be deposited using selective atomic layer deposition (ALD) such that the insulating layer 144 only wets/adheres to the material of the first electrode 132 but not to the nanoclusters of the dusting layer 142. Alternatively, the insulating layer 144 may be formed by oxidation or nitridation of the nanoclusters of the dusting layer 142. Thus, the insulating layer 144 may include an oxide or nitride of the metal of the nanoclusters of the dusting layer 142. The insulating layer may comprise stoichiometric or non-stoichoimetric $SiO_x$, $TaO_x$, $TiO_x$, $GeO_x$, $SnO_x$, $HfO_x$, $MgO_x$, $SiN_x$, $AlO_x$, $VO_x$, or $NiO_x$.

In one embodiment, the OTS selector 130 may comprise a bilayer first electrode 132 comprising a metal nitride lead lower conductor (e.g., TaN or TiN) and a carbon based upper conductor (e.g., amorphous carbon or CN). The dusting layer 142 may include an ultra-thin interfacial wetting layer (e.g., Ti or TiN, which are miscible with carbon or CN) and discrete nanoclusters of a different metal (e.g., Zr) for current focusing. The optional insulating layer 144 may be formed on the dusting layer 142. The above described OTS 134 and second electrode (e.g., metal, conductive metal nitride and/or a carbon based material electrode) 136 are formed over the dusting layer 142. If desired, an additional capping layer may be formed over the OTS selector 130 to separate it from a memory device to be described in more detail below.

Figure 2C:
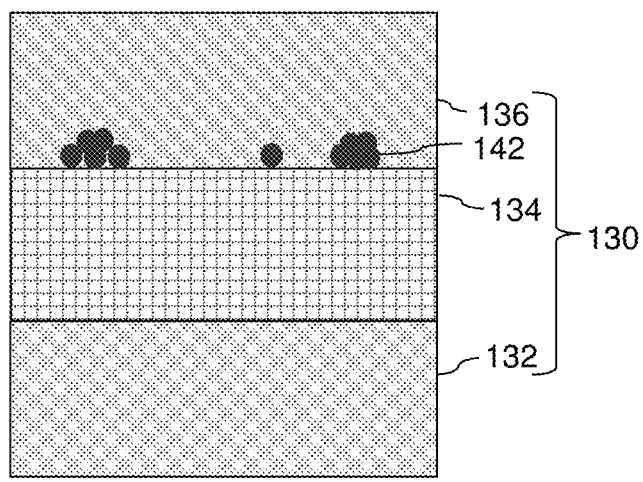
Figure 2D:
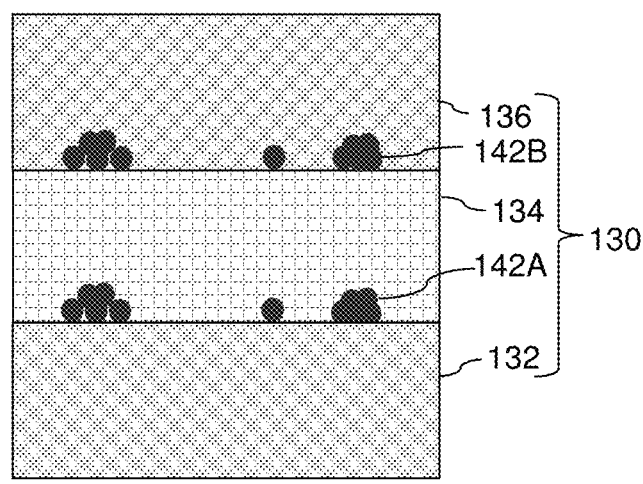

FIGS. 2C and 2D are vertical cross-sectional views of an OTS selector 130 with a current focusing layer according to alternative configurations of the first embodiment of the present disclosure. In the configuration of FIG. 2C, the dusting layer 142 may be located on the top surface of the OTS 134. In the configuration of FIG. 2D, a first dusting layer 142A may be located in contact with the bottom surface of the OTS 134 and a second dusting layer 142B may be located on the top surface of the OTS 134. The dusting layers of the configurations of FIGS. 2C and 2D may optionally be embedded in the insulating layer 144 shown in FIG. 2B.

Figure 3A:
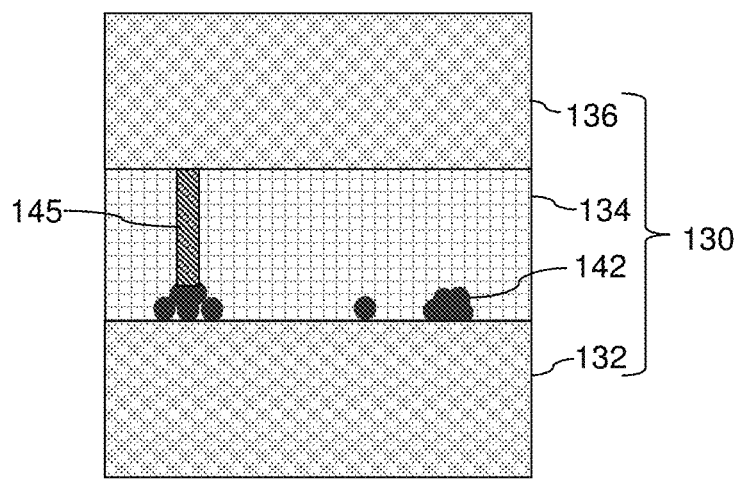
FIGS. 3A and 3B are vertical cross-sectional views of a step in a method of operating the OTS selectors of FIGS. 2A and 2B, respectively, according to the first embodiment of the present disclosure.
Figure 3B:
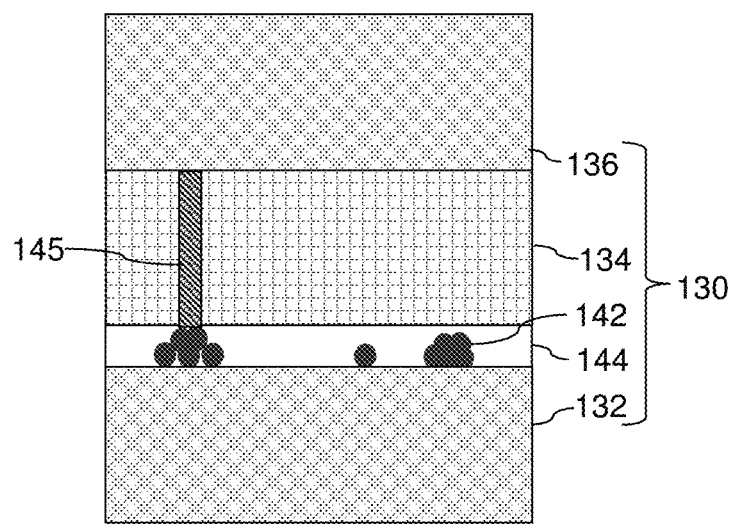

FIGS. 3A and 3B are vertical cross-sectional views of a step in a method of operating the OTS selectors 130 of FIGS. 2A and 2B, respectively, according to the first embodiment of the present disclosure. After an application of a voltage or current across the OTS 134 between the first electrode 132 and the second electrode 136, an electrically conductive filament 145 (i.e., an electrically conductive path) is formed through the OTS 134 between the first electrode 132 and the second electrode 136. The formation of the filament 145 switches the OTS selector 130 from the "OFF" (i.e., higher resistance) state into the "ON" (i.e., lower resistance) state. The methods of operating the OTS selectors 130 of FIGS. 2C and 2D are similar, except that the filament 145 may extend downward instead of upward during formation.

The presence of the dusting layer 142 focuses the current injection into the OTS 134 at one or more narrow points and confines the current in the OTS to a narrow area which results in enhanced electric field in narrow regions of the OTS 134. Without wishing to be bound by a particular theory, the inventors believe that this leads to a formation of the relatively narrow filament 145 in specific regions of the OTS 134 above the nanoclusters in the dusting layer 142. The filament 145 may have a width (i.e., in the direction parallel to the top surface of the first electrode 132) of 30 nm or less, such as 0.1 nm to 20 nm, for example 0.5 nm to 5 nm, such as 1 to 3 nm.

The point injection of the current lowers the hold current and tunes the offset voltage of the OTS selector 130 and thus improves the performance of the OTS selector 130. Furthermore, the point injection of the current may avoid the necessity of using a "first fire" initialization process of the OTS selector 130 which requires application of a high voltage between the first and second electrodes of the OTS selector 130 to initialize the OTS selector 130. Alternatively, it may reduce the voltage magnitude needed during the "first fire" initialization process of the OTS selector 130.

Figure 4A:
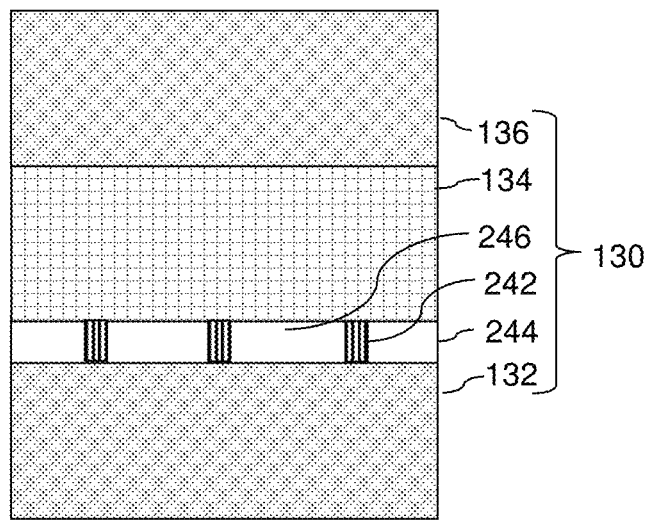
FIG. 4A is a vertical cross-sectional view of an OTS selector with a current focusing layer according to a second embodiment of the present disclosure.

FIG. 4A is a vertical cross-sectional view of an OTS selector 130 with a current focusing layer which comprises a metal-dielectric composite layer 244, according to a second embodiment of the present disclosure.

The metal-dielectric composite layer 244 includes discrete electrically conductive phase regions 242 embedded in an insulating dielectric matrix 246. The electrically conductive phase regions 242 function as confined current paths through the dielectric matrix 246. Given that the composite material may have a random distribution of conductive and dielectric regions, the current focusing path may be indirect (circuitous) and differ from the direct conductive path illustrated schematically in FIG. 4A. In one embodiment, the metal-dielectric composite layer 244 may comprise a current confined path (CCP) composite material, such as Cu:AlOx (i.e., copper doped aluminum oxide), Ag:AlOx (i.e., silver doped aluminum oxide) or AgIn:Mg—Zn—O (i.e., silver and indium doped magnesia stabilized zirconia) nanocomposites. For example, for the AgIn:Mg—Zn—O nanocomposite, the electrically conductive AgIn regions 242 (i.e., the silver indium conductive phase regions in a magnesia stabilized zirconia matrix 246) may have diameters of about 5 nm to 10 nm, such as about 7 nm. In one embodiment, the electrically conductive regions 242 may have a width of 10 nm or less such as 5 to 10 nm, and comprise any suitable metal, such as copper, silver, gold, indium, or alloys thereof (e.g., AgIn). The dielectric matrix may comprise any suitable dielectric, such as metal oxides, for example, alumina, zirconia, stabilized zirconia (e.g., magnesia stabilized zirconia, etc.) or silicon oxide. Suitable dielectrics could also include nitrides, such as silicon nitride.

Figure 4B:
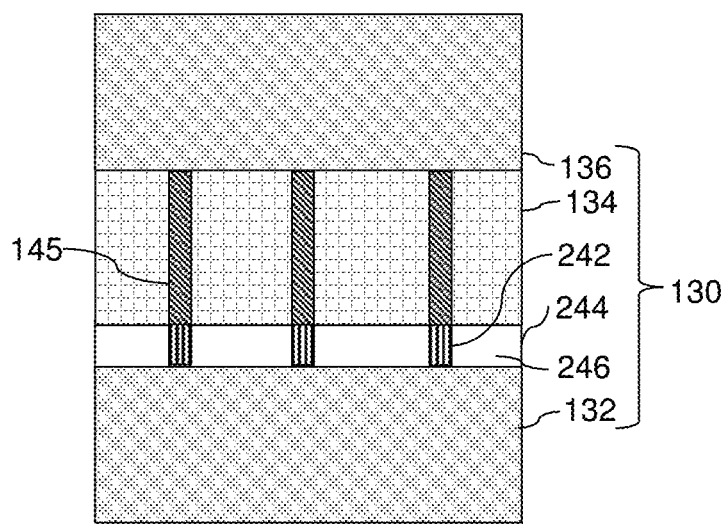
FIG. 4B is a vertical cross-sectional view of a step in a method of operating the OTS selector of FIG. 4A, according to the second embodiment of the present disclosure.

FIG. 4B is a vertical cross-sectional view of a step in a method of operating the OTS selector 130 of FIG. 4A, according to the second embodiment of the present disclosure. After an application of a voltage or current across the OTS 134 between the first electrode 132 and the second electrode 136, an electrically conductive filament 145 (i.e., an electrically conductive path) is formed through the OTS 134 between the first electrode 132 and the second electrode 136. The formation of the filament 145 switches the OTS selector 130 from the "OFF" (i.e., higher resistance) state into the "ON" (i.e., lower resistance) state.

The presence of the nanoscale conductive regions 242 in the composite layer 244 focuses the current injection into the OTS 134 at one or more narrow points and confines the current in the OTS to a narrow area which results in enhanced electric field in narrow regions of the OTS 134. Without wishing to be bound by a particular theory, the inventors believe that this leads to a formation of the relatively narrow filament 145 in specific regions of the OTS 134 above the nanoscale conductive regions 242. The filament 145 may have a width (i.e., in the direction parallel to the top surface of the first electrode 132) of 30 nm or less, such as 0.1 nm to 20 nm, for example 0.5 nm to 5 nm, such as 1 to 3 nm.

Figure 5A:
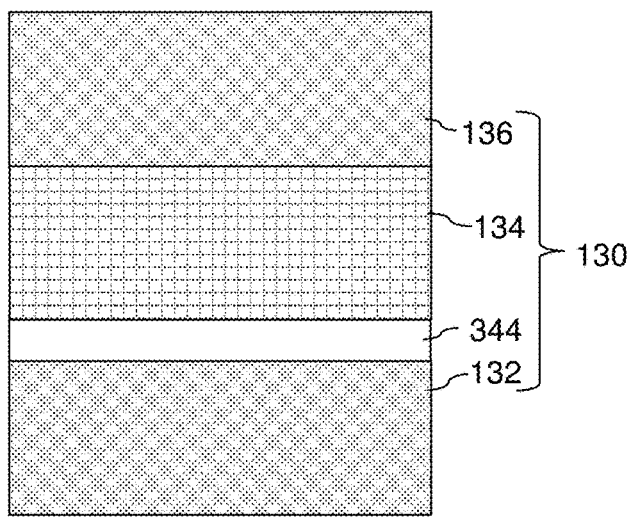
FIG. 5A is a vertical cross-sectional view of an OTS selector with a current focusing layer according to a third embodiment of the present disclosure.

FIG. 5A is a vertical cross-sectional view of an OTS selector with a current focusing layer which comprises a filamentary breakdown layer 344 which forms electrically conductive filaments upon application of a current and/or voltage across the dielectric layer, according to a third embodiment of the present disclosure.

The filamentary breakdown layer 344 may comprise any suitable dielectric oxide or nitride which forms electrically conductive filaments upon application of a current and/or voltage across the filamentary breakdown layer. For example, the filamentary breakdown layer 344 may comprise stoichiometric or non-stoichiometric dielectric or semiconductor material, such as $SiO_x$, $TaO_x$, $TiO_x$, $GeO_x$, $SnO_x$, $HfO_x$, $MgO_x$, $SiN_x$, $AlO_x$, $VO_x$, $NiO_x$, GeSe, GeTe, $ZrO_x$, ZrTe or ternary or quaternary compounds thereof. The filamentary breakdown layer 344 may have a thickness of 2 nm or less, such as 0.1 to 1 nm.

Figure 5B:
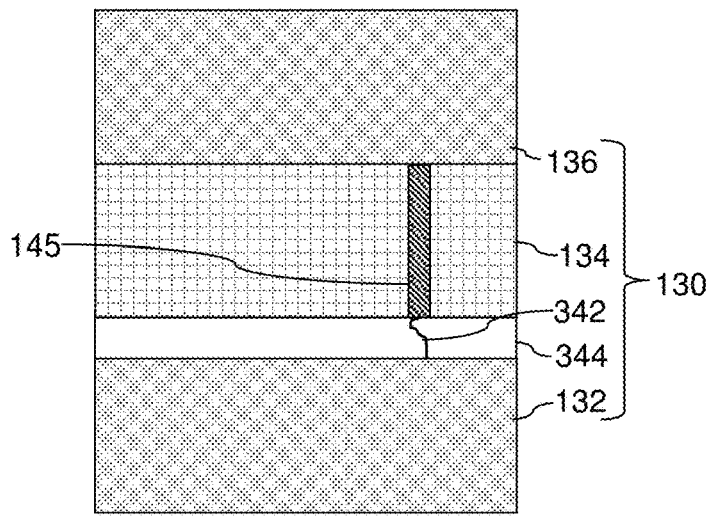
FIG. 5B is a vertical cross-sectional view of a step in a method of operating the OTS selector of FIG. 5A, according to the third embodiment of the present disclosure.

FIG. 5B is a vertical cross-sectional view of a step in a method of operating the OTS selector 130 of FIG. 5A, according to the third embodiment of the present disclosure. When a sufficiently large voltage is applied across the filamentary breakdown layer 344, matrix (e.g., dielectric or semiconductor) breakdown will occur, creating a conductive path (e.g., a narrow conductive filament) 342 through the filamentary breakdown layer 344. The mechanism for matrix breakdown can be oxygen or nitrogen vacancy formation (e.g., as may occur in a titanium oxide vacancy/barrier modulated resistive RAM memory cell) and/or a metal bridge formation (e.g., as may occur in silicon oxide similar to an antifuse or conductive bridge type resistive RAM memory cell). The conductive filament 342 may have a width of 10 nm or less such as 0.5 to 2 nm any may comprise the non-oxygen or nitride component of the oxide or nitride (e.g., Si, Ti, Ta, Mg, Hf, Al, etc.).

After an application of a voltage or current across the OTS 134 and the filamentary breakdown layer 344 between the first electrode 132 and the second electrode 136, the conductive filament 342 forms through the filamentary breakdown layer 344 and provides the current/field focusing at the interface with the OTS 134. This causes the electrically conductive filament 145 (i.e., an electrically conductive path) to be formed through the OTS 134 between the first electrode 132 and the second electrode 136. The formation of the filament 145 switches the OTS selector 130 from the "OFF" (i.e., higher resistance) state into the "ON" (i.e., lower resistance) state.

The formation of the conductive filament 342 in the filamentary breakdown layer 344 focuses the current injection into the OTS 134 at one or more narrow points and confines the current in the OTS to a narrow area which results in enhanced electric field in narrow regions of the OTS 134. Without wishing to be bound by a particular theory, the inventors believe that this leads to a formation of the relatively narrow filament 145 in specific regions of the OTS 134 above the conductive filaments 342. The filament 145 may have a width (i.e., in the direction parallel to the top surface of the first electrode 132) of 30 nm or less, such as 0.1 nm to 20 nm, for example 0.5 nm to 5 nm, such as 1 to 3 nm.

Figure 5C:
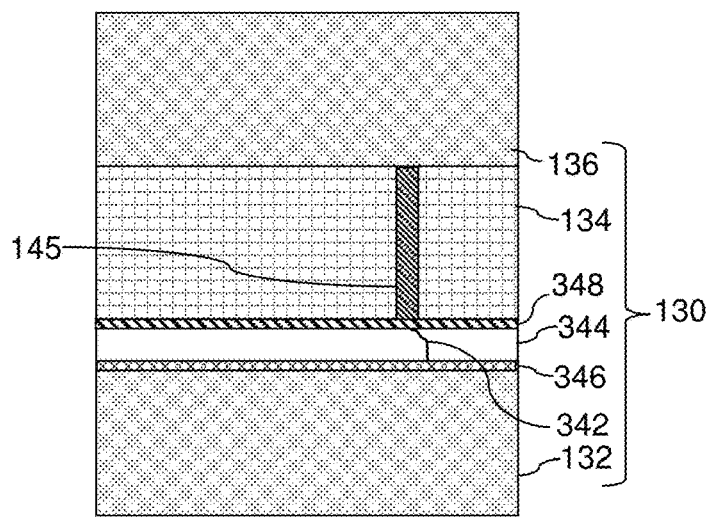
FIG. 5C is a vertical cross-sectional view of a step in a method of operating an OTS selector with a current focusing layer according to an alternative configuration of the third embodiment of the present disclosure.

FIG. 5C is a vertical cross-sectional view of a step in a method of operating an OTS selector with a current focusing layer according to an alternative configuration of the third embodiment of the present disclosure. In this embodiment, at least one additional electrode layer 346 and/or 348 is located between the first electrode 132 and the OTS 134. For example, a metal source electrode 346 may be formed between the first electrode 132 and the filamentary breakdown layer 344. For example, the metal source electrode 346 may comprise a thin metal layer, such as Ta, Cu, Ti, Au or Ag, when the first electrode 132 comprises a carbon based material, such as CN. The metal source electrode 346 may provide a source of metal atoms which form a conductive bridge in the filamentary breakdown layer 344. In another example, a buffer electrode 348 may be located between the filamentary breakdown layer 344 and the OTS 134. The buffer electrode 348 may comprise a carbon based material, such as amorphous carbon or CN, or a metal layer, such as Ru or Rh. In one embodiment, both electrodes 346 and 348 may be present in the OTS selector 130.

The various embodiments of the present disclosure provide a current focusing layer which includes discrete electrically conductive current focusing regions having a width of 30 nm or less, such as 0.5 nm to 20 nm, including 5 nm to 10 nm. The current focusing regions may comprise nanoclusters, conductive phase regions in a composite material or conductive filaments in a filamentary breakdown layer. This permits device size reduction while still providing enough voltage to OTS 134 with low leakage (i.e., OFF) current. The current focusing regions providing nucleation sites for filament 145 formation in the OTS 134 and eliminates or reduces first fire (forming) voltage to near or equal to the OTS threshold voltage. This can eliminate a "burn-in" set to establish the device threshold, saving time and reducing processing cost. Reduced threshold voltage may also be obtained which leads to reduced current and power for the memory cell. Lower hold current due to filamentary or point contact also may be obtained with helps improve the performance of the OTS selector 130.

Figure 6A:
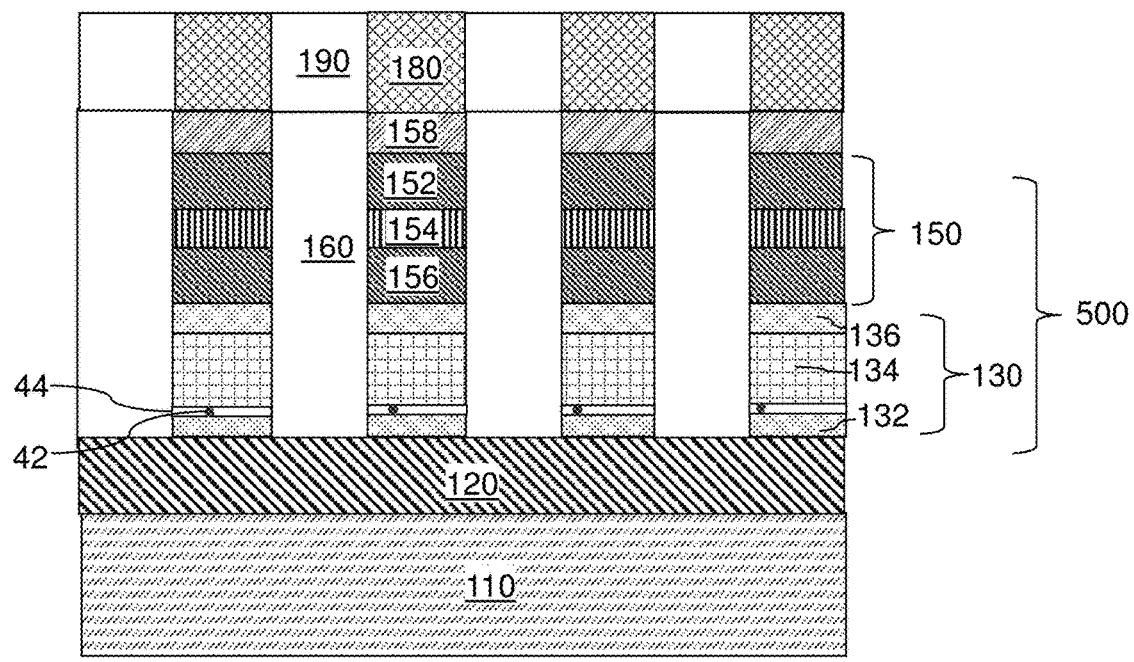
FIGS. 6A and 6B are vertical cross-sectional view of an OTS selector with the current focusing layer located in MRAM memory cells according to various embodiments of the present disclosure.
Figure 6B:
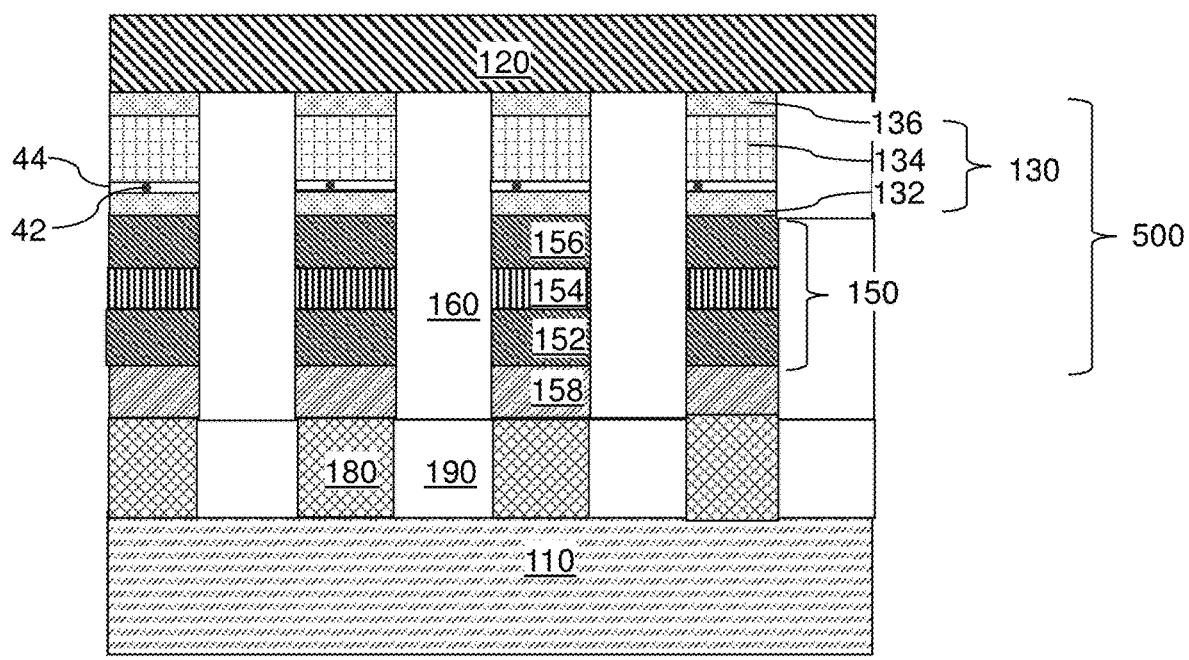

In one embodiment, the OTS selector 130 of the first, second or third embodiment described above may be used in a magnetoresistive random access memory ("MRAM") cell 500 shown in FIGS. 6A and 6B. As described above, the OTS selector 130 of the first, second or third embodiment includes a current focusing layer 44 which includes discrete electrically conductive current focusing regions 42 comprising nanoclusters, conductive phase regions or conductive filaments. Each MRAM cell 500 may contain a magnetic tunnel junction (MTJ) 150 in electrical series with the OTS selector 130. In one embodiment, the MRAM cell 500 may comprised a spin-transfer torque (STT) type MRAM cell.

Referring to FIG. 6A, first electrically conductive lines (e.g., bit lines or word lines) 120 are formed over a substrate 110. Dielectric rails (not shown in the view of FIG. 6A) are then formed between the first electrically conductive lines 120 by depositing the dielectric material layer between the first electrically conductive lines 120 and planarizing the dielectric material layer.

A layer stack including an optional metallic cap layer 158 and a MTJ stack 150 is formed over the first electrically conductive lines 120 located over the substrate 110. The stack includes, from top to bottom, the metallic cap layer 158, a reference layer 152 (which is also referred to as a magnetic pinned layer), a tunnel barrier layer 154, and a free layer 156, which together form an MTJ stack 150 of the STT memory cell. The thickness of the MTJ stack 150 can be in a range from 10 nm to 40 nm, such as 20 nm to 30 nm.

The metallic cap layer 158 includes a nonmagnetic metallic material such as at least one nonmagnetic transition metal or a nonmagnetic transition metal alloy. For example, the metallic cap layer 158 may include, and or may consist essentially of, Ti, V, Cr, Mn, Zr, Nb, Mo, Tc, Ru, Rh, Hf, Ta, W, Re, Os, Jr, alloys thereof, or a conductive metallic nitride (e.g., TaN, TiN) or a conductive metallic carbide (e.g. WC) thereof. The metallic cap layer 158 may be deposited by physical vapor deposition or chemical vapor deposition. The thickness of the metallic cap layer 158 may be in a range from 1 nm to 20 nm, such as from 2 nm to 10 nm, although lesser and greater thicknesses can also be employed.

The reference layer 152 can have a fixed magnetization direction which can be a horizontal direction or a vertical direction. The reference layer 152 can be formed as single ferromagnetic material layer or multiple ferromagnetic material layers that are magnetically coupled among one another to provide a same magnetization direction throughout. The reference layer 152 may include a Co/Ni multilayer structure or a Co/Pt multilayer structure. In one embodiment, the reference layer 152 can additionally include a thin non-magnetic layer comprised of tantalum or tungsten having a thickness in a range from 0.2 nm to 0.5 nm and a thin CoFeB layer having a thickness in a range from 0.5 nm to 3 nm. The thickness of the reference layer 152 can be in a range from 2 nm to 5 nm.

Optionally, the reference layer 152 may be provided in a synthetic antiferromagnet (SAF) structure that includes a hard magnetization layer (not expressly shown), an antiferromagnetic coupling layer (e.g., a Ru layer, not expressly shown), and the reference layer 152. In case the reference layer 152 is provided as a component of an SAF structure, the magnetization of the hard magnetization layer and the magnetization of the magnetic pinned layer can be antiferromagnetically coupled through the antiferromagnetic coupling layer.

The tunnel barrier layer 154 can include a tunnel barrier dielectric material such as magnesium oxide or aluminum oxide. The tunnel barrier layer 154 can have a thickness in a range from 0.6 nm to 2 nm, such as from 0.8 nm to 1.2 nm. The tunnel barrier layer 154 contacts the reference layer 152, and provides spin-sensitive tunneling of electrical currents between the reference layer 152 and the free layer 156. In other words, the amount of electrical current that passes through the tunnel barrier layer 154 depends on the relative alignment of magnetization between the reference layer 152 and the free layer 156, i.e., whether the magnetization directions are parallel or antiparallel to each other.

The free layer 156 can be formed as single ferromagnetic material layer or multiple ferromagnetic material layers that are magnetically coupled among one another to provide a same magnetization direction throughout. The thickness of the free layer 156 is less than 2 nm, and preferably less than 1.5 nm, such as from 0.8 nm to 1.5 nm. For example, the free layer 156 can include a CoFeB layer and/or a CoFe layer. The free layer 156 can be programmed by flowing electrical current along a vertical direction either upward or downward. Additional layers (not shown) may be included in the MTJ 150.

The above described layers are then patterned into memory pillar structures (158, 152, 154, 156, and 130). Any suitable patterning method may be used. For example, photolithography and etching may be used to pattern the stack of the OTS selector 130 layers, while ion beam milling may be used to pattern the MTJ stack 150 and the metallic cap layer 158. A dielectric isolation structure 60 is then formed such that it laterally surrounds the two-dimensional array of memory pillar structures (158, 152, 154, 156, and 130).

Each memory pillar structure (158, 152, 154, 156, and 130) comprises a MRAM memory cell 500 containing the MTJ 150 in which the tunnel barrier layer 154 is located between the reference layer 152 and the free layer 156. The metallic cap layer 158 is located on one side (e.g., above) of the MTJ 150. The OTS selector 130 is located on the other side (e.g., below) the MTJ 150.

Second electrically conductive lines 180 (e.g., the other ones of the bit lines or the word lines) may be formed over the memory pillar structures (158, 152, 154, 156, and 130) by depositing one or more electrically conductive layers, followed by patterning the one or more electrically conductive layers by reactive ion etching (RIE) to form the lines 180. The second dielectric rails 190 are then formed between the second electrically conductive lines 180 by depositing the dielectric material layer between the second electrically conductive lines 180 and planarizing the dielectric material layer.

FIG. 6B illustrates an alternative embodiment of the MRAM memory cell 500. In this embodiment, the OTS selector 130 is formed over the MTJ 150.

Figure 7:
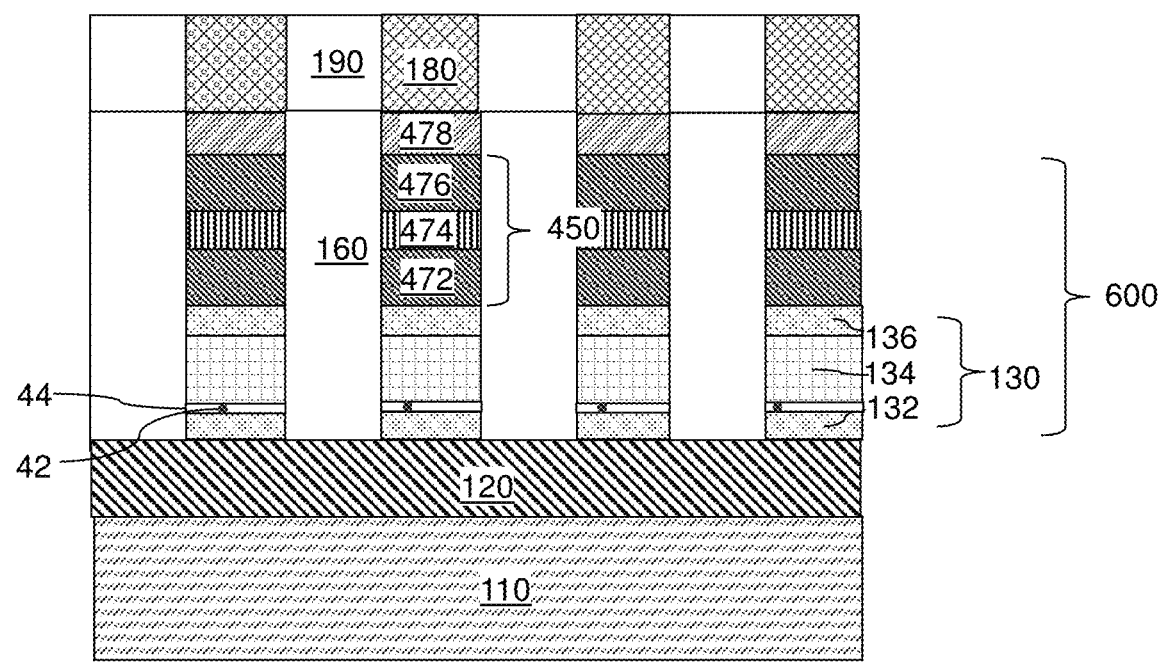
FIG. 7 is a vertical cross-sectional view of an OTS selector with the current focusing layer located in a phase change memory cell according to various embodiments of the present disclosure.

In another embodiment shown in FIG. 7, the OTS selector 130 of the first, second or third embodiment described above may be used in phase change memory (PCM) cell 600 containing a phase change random access memory ("PCRAM" or "PRAM") device 450, rather than in the MRAM memory cell 500.

The PCM device 450 includes non-metallic conductive material layer 478. Exemplary non-metallic conductive materials that can be employed for layer 478 include amorphous carbon, amorphous boron-doped carbon, or amorphous nitrogen-doped carbon (CN). The non-metallic conductive material layer 478 thickness in a range from 10 nm to 50 nm, such as from 20 nm to 30 nm, although lesser and greater thicknesses may also be employed.

A relatively thin upper metallic material layer 476 located below layer 478 may include an elemental metal, such as W or Ru, and/or a conductive metallic compound material, such as TiN, TaN, or WN. The upper metallic material layer 476 can have a thickness in a range from 1 nm to 5 nm, such as from 2 nm to 3 nm, although lesser and greater thicknesses may also be employed.

A memory material layer comprising a phase change memory material layer 474 is located below layer 476. As used herein, a "phase change memory material" refers to a material having at least two different phases providing different resistivity. The at least two different phases can be provided, for example, by controlling the rate of cooling from a heated state to provide an amorphous state having a higher resistivity and a polycrystalline state having a lower resistivity. In this case, the higher resistivity state of the phase change memory material can be achieved by faster quenching of the phase change memory material after heating to an amorphous state, and the lower resistivity state of the phase change memory material can be achieved by slower cooling of the phase change memory material after heating to the amorphous state.

Exemplary phase change memory materials include, but are not limited to, germanium antimony telluride compounds such as $Ge_2Sb_2Te_5$ (GST), germanium antimony compounds, indium germanium telluride compounds, aluminum selenium telluride compounds, indium selenium telluride compounds, and aluminum indium selenium telluride compounds. These compounds (e.g., compound semiconductor material) may be doped (e.g., nitrogen doped GST) or undoped. Thus, the resistive memory material layer can include, and/or can consist essentially of, a material selected from a germanium antimony telluride compound, a germanium antimony compound, an indium germanium telluride compound, an aluminum selenium telluride compound, an indium selenium telluride compound, or an aluminum indium selenium telluride compound. In this case, the thickness of the at least one memory material layer can be in a range from 10 nm to 60 nm, such as from 20 nm to 50 nm and/or from 25 nm to 35 nm, although lesser and greater thicknesses can also be employed.

A lower first metallic material layer 472 is located below layer 474. The lower metallic material layer 472 may include an elemental metal, such as W or Ru, and/or a conductive metallic compound material, such as TiN, TaN, or WN. The lower metallic material layer 472 can have a thickness in a range from 1 nm to 5 nm, such as from 2 nm to 3 nm, although lesser and greater thicknesses may also be employed. In an alternative embodiment, the PCM device 450 may be located below the OTS selector 130, similar to the configuration shown in FIG. 6B for the MRAM cell 500.

According to embodiments of the present disclosure, a memory cell (500, 600) includes an ovonic threshold switch (OTS) selector 130 containing a first electrode 132, a second electrode 136, an OTS 134 located between the first electrode and the second electrode, and a current focusing layer 44 containing discrete electrically conductive current focusing regions 42 having a width of 30 nm or less located between the first electrode 132 and the OTS 134, and a memory device (150, 450) located in electrical series with the OTS selector 130. In one embodiment, the discrete electrically conductive current focusing regions 42 have a width of 0.5 nm to 20 nm.

In the first embodiment, the current focusing layer 44 comprises an electrically conductive dusting layer 142, and the discrete electrically conductive current focusing regions 42 comprise electrically conductive nanoclusters of the dusting layer 142. The electrically conductive nanoclusters may comprise an elemental metal selected from Ti, Zr, Jr, Mg, Pt, W, Ta, Hf, Cr, Fe, Cu, Nb, Mo, Sc, Y, Pd, Au, Os, Ru, or Rh, or an electrically conductive metal nitride.

The electrically conductive nanoclusters may be located on a metal layer of the first electrode 132 which is immiscible with a material of the conductive nanoclusters. For example, the electrically conductive nanoclusters and the metal layer comprise an immiscible metal layer pair selected from Zr/Ti, Au/Cr, Cu/Nb, Fe/Os, Fe/Ru, Mo/Sc, Os/Pt, Sc/Y, or Ti/Zr.

In the configuration shown in FIG. 2A, the OTS 134 surrounds and directly contacts the electrically conductive nanoclusters of the dusting layer 142. In the alternative configuration shown in FIG. 2B, the electrically conductive nanoclusters of the dusting layer 142 are embedded in an electrically insulating layer 144 such that surface of the electrically conductive nanoclusters are exposed in a surface of the insulating layer which directly contacts the OTS 134. The OTS 134 directly contacts the exposed surface of the electrically conductive nanoclusters of the dusting layer 142.

In the second embodiment shown in FIG. 4A, the current focusing layer 44 comprises a metal-dielectric composite layer 244, and the discrete electrically conductive current focusing regions 42 comprise metal phase regions 242 embedded in dielectric matrix 246 of the composite layer 244. The metal phase regions 242 may comprise copper, silver, gold, indium, or alloys thereof, and the dielectric matrix 246 may comprise alumina, zirconia, stabilized zirconia or silicon oxide.

In the third embodiment shown in FIGS. 5A and 5B, the current focusing layer 144 comprises a filamentary breakdown layer 344 which forms electrically conductive filaments 342 upon application of a current and/or voltage across the filamentary breakdown layer, and the discrete electrically conductive current focusing regions comprise the electrically conductive filaments 342. The filamentary breakdown layer 344 may comprise a stoichiometric or non-stoichiometric dielectric or semiconductor material selected from $SiO_x$, $TaO_x$, $TiO_x$, $GeO_x$, $SnO_x$, $HfO_x$, $MgO_x$, $SiN_x$, $AlO_x$, $VO_x$, $NiO_x$, GeSe, GeTe, $ZrO_x$, ZrTe or ternary or quaternary compounds thereof.

The memory device (150, 450) may comprise a magnetic tunnel junction 150 or a phase change memory device 450. In general, the OTS selector 130 of the first, second or third embodiments can be used with any memory devices in any configuration, such as in cross-point memory architecture, to help prevent sneak path currents.

A method of operating the memory cell of embodiments of the present disclosure comprises applying a voltage or current across the OTS 134 between the first electrode 132 and the second electrode 136 to form an electrically conductive filament 145 through the OTS 134 between the first electrode and the second electrode to switch the OTS selector 130 from a higher resistance state into a lower resistance state. The discrete electrically conductive current focusing regions 42 focus current injection into the OTS 134 at one or more points which confines the current in the OTS and forms the electrically conductive filaments 145 in specific regions of the OTS adjacent to the electrically conductive current focusing regions 42.

A method of making the memory cell (500, 600) comprises forming the OTS selector 130 and forming a memory device (150, 450) located in electrical series with the OTS selector 130. In the first embodiment, the current focusing layer 44 comprises an electrically conductive dusting layer 142, and the discrete electrically conductive current focusing regions 44 comprise electrically conductive nanoclusters of the dusting layer 142.

The method of the first embodiment may further comprise depositing a continuous layer of a first metal on the first electrode, and depositing a second metal which is immiscible with the first metal on the continuous layer to form the electrically conductive nanoclusters of the second metal on the continuous layer.

Alternatively, the method of the first embodiment may further comprise depositing a metal on a carbon based material, wherein the carbon based material changes a local morphology of the metal to form the electrically conductive nanoclusters. Alternatively, the method of the first embodiment may further comprise sputter etching the electrically conductive dusting layer to form the electrically conductive nanoclusters.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory cell, comprising:
    an ovonic threshold switch (OTS) selector comprising:
        a first electrode;
        a second electrode;
        an OTS located between the first electrode and the second electrode; and
        a current focusing layer comprising discrete electrically conductive current focusing regions having a width of 30 nm or less located between the first electrode and the OTS; and
    a memory device located in electrical series with the OTS selector.

2. The memory cell of claim 1, wherein the discrete electrically conductive current focusing regions have a width of 0.5 nm to 20 nm.

3. The memory cell of claim 1, wherein the current focusing layer comprises an electrically conductive dusting layer, and the discrete electrically conductive current focusing regions comprise electrically conductive nanoclusters of the dusting layer.

4. The memory cell of claim 3, wherein the electrically conductive nanoclusters comprise an elemental metal selected from Ti, Zr, Ir, Mg, Pt, W, Ta, Hf, Cr, Fe, Cu, Nb, Mo, Sc, Y, Pd, Au, Os, Ru, or Rh, or an electrically conductive metal nitride.

5. The memory cell of claim 4, wherein the electrically conductive nanoclusters are located on a metal layer of the first electrode which is immiscible with a material of the conductive nanoclusters.

6. The memory cell of claim 5, wherein the electrically conductive nanoclusters and the metal layer comprise an immiscible metal layer pair selected from Zr/Ti, Au/Cr, Cu/Nb, Fe/Os, Fe/Ru, Mo/Sc, Os/Pt, Sc/Y, or Ti/Zr.

7. The memory cell of claim 3, wherein the OTS surrounds and directly contacts the electrically conductive nanoclusters.

8. The memory cell of claim 3, wherein:
    the electrically conductive nanoclusters are embedded in an electrically insulating layer such that surface of the electrically conductive nanoclusters are exposed in a surface of the insulating layer which directly contacts the OTS; and
    the OTS directly contacts the exposed surface of the electrically conductive nanoclusters.

9. The memory cell of claim 1, wherein the current focusing layer comprises a metal-dielectric composite layer, and the discrete electrically conductive current focusing regions comprise metal phase regions embedded in a dielectric matrix of the metal-dielectric composite layer.

10. The memory cell of claim 9, wherein:
    the metal phase regions comprise copper, silver, gold, indium, or alloys thereof; and
    the dielectric matrix comprises alumina, zirconia, stabilized zirconia or silicon oxide.

11. The memory cell of claim 1, wherein the current focusing layer comprises a filamentary breakdown layer which forms electrically conductive filaments upon application of a current and/or voltage across the filamentary breakdown layer, and the discrete electrically conductive current focusing regions comprise the electrically conductive filaments.

12. The memory cell of claim 11, further comprising:
    a source electrode located between the first electrode and the filamentary breakdown layer; and
    a buffer electrode located between the filamentary breakdown layer and the OTS.

13. The memory cell of claim 12, wherein:
    the filamentary breakdown layer comprises a stoichiometric or non-stoichiometric dielectric or semiconductor material selected from $SiO_x$, $TaO_x$, $TiO_x$, $GeO_x$, $SnO_x$, $HfO_x$, $MgO_x$, $SiN_x$, $AlO_x$, $VO_x$, $NiO_x$, GeSe, GeTe, $ZrO_x$, ZrTe or ternary or quaternary compounds thereof;
    the source electrode comprises a metal layer selected from Ta, Cu, Ti, Au or Ag; and
    the buffer electrode comprises Ru, Rh or a carbon based material.

14. The memory cell of claim 1, wherein the memory device comprises a magnetic tunnel junction or a phase change memory device.

15. A method of operating the memory cell of claim 1, comprising applying a voltage or current across the OTS between the first electrode and the second electrode to form an electrically conductive filament through the OTS between the first electrode and the second electrode to switch the OTS selector from a higher resistance state into a lower resistance state, wherein the discrete electrically conductive current focusing regions focus current injection into the OTS at one or more points which confines the current in the OTS and forms the electrically conductive filaments in specific regions of the OTS adjacent to the electrically conductive current focusing regions.

16. A method of making a memory cell, comprising:
    forming ovonic threshold switch (OTS) selector comprising:
        a first electrode;
        a second electrode;
        an OTS located between the first electrode and the second electrode; and
        a current focusing layer comprising discrete electrically conductive current focusing regions having a width of 30 nm or less located between the first electrode and the OTS; and forming a memory device located in electrical series with the OTS selector.

17. The method of claim 16, wherein the current focusing layer comprises an electrically conductive dusting layer, and the discrete electrically conductive current focusing regions comprise electrically conductive nanoclusters of the dusting layer.

18. The method of claim 17, further comprising:
depositing a continuous layer of a first metal on the first electrode; and
depositing a second metal which is immiscible with the first metal on the continuous layer to form the electrically conductive nanoclusters of the second metal on the continuous layer.

19. The method of claim 17, further comprising depositing a metal on a carbon based material, wherein the carbon based material changes a local morphology of the metal to form the electrically conductive nanoclusters.

20. The method of claim 17, further comprising sputter etching the electrically conductive dusting layer to form the electrically conductive nanoclusters.

\* \* \* \* \*